United States Patent [19]

Clinton et al.

[11] 4,056,771

[45] Nov. 1, 1977

[54] REMOTELY CONTROLLED HIGH POTENTIAL INSULATION TESTER

[75] Inventors: Henry H. Clinton, Ivoryton; David A. Zeichner, Madison, both of Conn.

[73] Assignee: Clinton Instrument Company, Clinton, Conn.

[21] Appl. No.: 707,892

[22] Filed: July 22, 1976

[51] Int. Cl.² .......................................... G01R 31/14
[52] U.S. Cl. ............................................... 324/54
[58] Field of Search .......................... 324/54, 51, 52; 57/58.52

[56] References Cited

U.S. PATENT DOCUMENTS

| | | | |
|---|---|---|---|
| 3,491,290 | 1/1970 | Peschel | 324/54 |
| 3,593,123 | 7/1971 | Williamson | 324/51 |
| 3,628,133 | 12/1971 | Dornberger | 324/52 |
| 3,763,426 | 10/1973 | Wilkes | 324/54 |
| 3,945,182 | 3/1976 | Dover et al. | 57/58.52 |
| 3,970,924 | 7/1976 | Pendleton et al. | 324/54 |
| 3,988,666 | 10/1976 | Rowland et al. | 324/54 |

*Primary Examiner*—Gerard R. Strecker
*Attorney, Agent, or Firm*—McCormick, Paulding & Huber

[57] ABSTRACT

A remotely controlled high potential dc insulation tester includes a dc power supply and a high voltage electrode mounted within a rotating mechanism and performs insulation tests on conductors which are within the same rotating mechanism. The power supply receives low voltage electrical power from outside of the rotating mechanism, and is monitored and controlled from a remote station in a non-rotating environment. Detecting circuits at the remote station determine the number of faults in a conductor drawn past the electrode and identify large faults such as bare-wire intervals along the conductor.

11 Claims, 3 Drawing Figures

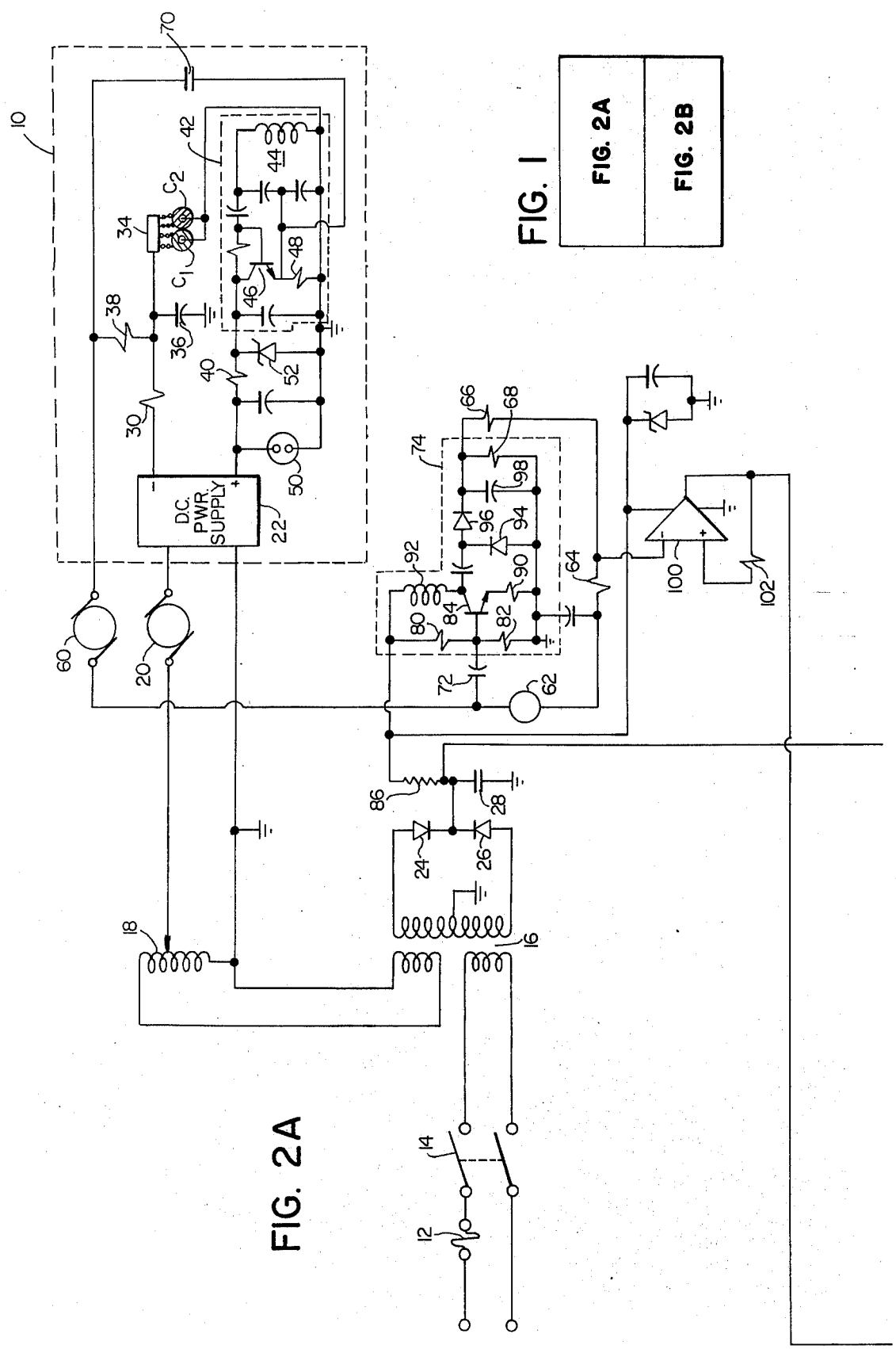

REMOTELY CONTROLLED HIGH POTENTIAL INSULATION TESTER

BACKGROUND OF THE INVENTION

The present invention relates to insulation testing equipment is concerned, more particularly, with high potential dc insulation testers having remote controls and monitoring equipment for testing electrical cabling within a rotating mechanism.

Very often in the wire and cable industry, two insulated conductors will be twisted together to form what is called a twisted pair. The twisted pair is the basic component of many types of multi-conductor cables. The manufacture of a twisted pair is accomplished through the use of a machine called a "twinner" or pairing machine and while there are several ways in which two conductors may be twisted together, one method is enjoying increasing popularity. In this method, the individual conductors are fed from stationary spools or pay-offs through guides to a take-up reel which is mounted inside a gimbal-like assembly about which rotates a member called a bow. The bow is rotated about an axis along which the insulated conductors are fed from the spools to effect a twisting of the wires before they are wound on the take-up reel. One machine which operates in this manner is shown and described in U.S. Pat. No. 3,945,182 issued Mar. 23, 1976.

One test that the twisted pair must pass prior to shipment or use in other multi-conductor cables is an insulation test in which a high electrical potential is applied between the surface of the insulation and the conductor. If the insulation is defective, due to, for example, a pin hole, a spark will jump from the point of application through the defect to the conductor. Such testing is commonly called "spark testing" and defects in the insulation may be sensed, counted and measured through the pulse of current manifested by the spark.

It is most desirable to spark test the twisted pair as they are wound on the take-up reel to save time and keep production costs down. However, the only place that the wires exist as a twisted pair is inside the rotating bow, just before they are wound on the take-up reel. This presents certain problems in the spark testing of the wire.

One problem is that the high potential test electrode must be inside the bow, where space is limited, and there can be no directly wired connections to the electrode because of the bow rotation. This means that slip rings attached to the bow machinery must be used. Space limitations on existing machines dictate that only two low voltage slip rings are available for this purpose. Because of this, and because of the many functions a spark tester may be called upon to serve, existing designs for spark testers have controls and indicators inside the twinner bow. This makes adjustment of the controls inconvenient and time consuming because the high inertia machinery must be stopped each time an adjustment is made and then restarted.

The present invention overcomes these difficulties by locating all controls and indicators at a suitable remote location, so that adjustments may be made as the machinery is operated, and by locating the high potential components within the rotating mechanism. Other objects of the invention are to detect bare wire intervals of significant length, to determine whether the number of pin hole faults per unit length exceeds a given or preset value, and to provide signals or electrical contact closures for the control of the machinery whenever either of these fault conditions exist.

SUMMARY OF THE INVENTION

The present invention resides in a remotely controlled high potential dc insulation tester for testing electrical conductors within a rotating mechanism.

The insulation tester includes a high potential dc power supply mounted within the rotating mechanism and the power supply is provided with first and second output terminals between which the high potential is generated during tests. A contact electrode is connected to one of the output terminals of the power supply and is supported within the rotating mechanism to apply that potential to the insulation. In one form, the electrode may include strings of beads which rest on the insulation of the twisted conductors as they are wound onto the take-up reel of a pairing machine.

Current sensitive means within the rotating mechanism is connected with one of the output terminals of the power supply, preferably the terminal which is not connected with the electrode, and produces a low voltage output signal indicative of current flowing between the terminals of the power supply at all times during a test. Thus, when a spark emanates from the electrode due to a fault in the insulation, a step increase in the current signal occurs.

Rotatable electrical coupling means connects with the current sensitive means to receive the output signal from within the rotating mechanism and transmits the signal to a remote station in the non-rotating environment for measurement, counting or other detecting functions.

Low voltage electrical power may also be transmitted through another rotating coupling to the high potential power supply within the rotating mechanism. Thus, all high potential parameters may be confined to the regin within the rotating mechanism, and control and monitoring functions can be handled at a remote station in a non-rotating environment.

BRIEF DESCRIPTION OF THE DRAWINGS

FIG. 1 is a key diagram illustrating the interconnecting relationship of FIGS. 2A and 2B.

FIG. 2A is an electrical schematic illustrating a portion of the high potential dc insulation tester including the components which are mounted within a rotating mechanism during an insulation test.

DESCRIPTION OF THE PREFERRED EMBODIMENTS

Figure 2B:
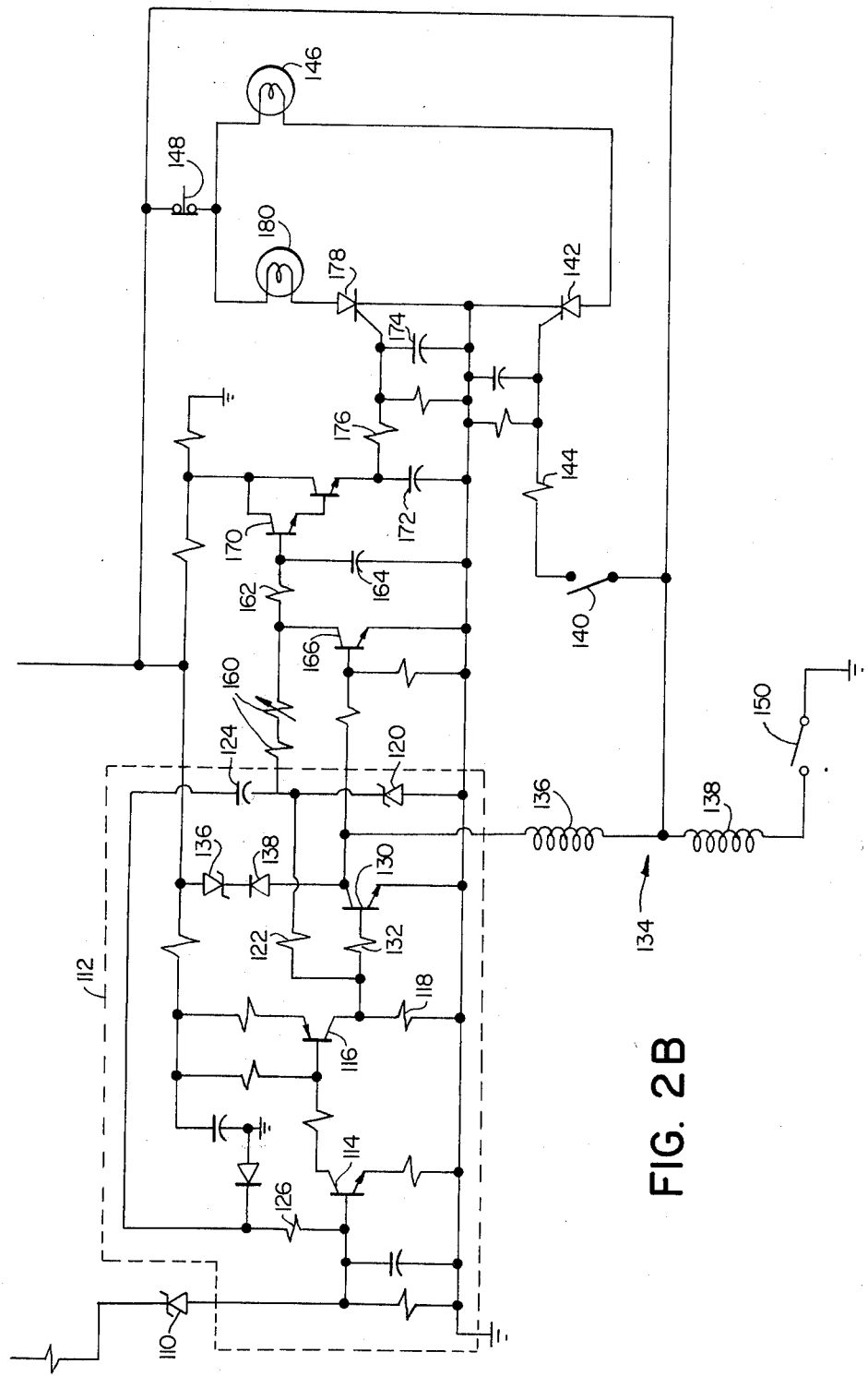
FIG. 2B is an electrical diagram illustrating the remaining portion of the high potential dc insulation tester.

The high potential dc insulation tester is illustrated in the electrical diagram of FIGS. 2A and 2B, and the portion of the equipment which is normally mounted within a rotating mechanism with twisted conductors $C_1$ and $C_2$ under test is enclosed within the dotted line 10 in FIG. 2A. For the most part, the balance of the electrical diagram depicts that part of the equipment contained in a control unit at a remote station in a non-rotating environment.

In FIG. 2A, low voltage utility power such as 120 vac, 60 cycle power, is supplied through a fuse 12 and power switch 14 to a transformer 16. The secondary of the transformer energizes a rectifier comprised of diodes 24, 26 and a filtering capacitor 28 to provide dc power for the detection circuits. One primary of the transformer energizes an autotransformer 18 which may be adjusted from the control unit. The variable output of autotransformer 18 is applied from the non-rotating environment through a slip ring assembly 20 and machine ground to the input terminals of a high potential dc power supply 22 mounted within the rotating mechism such as the bow of the pairing machine disclosed in the patent referenced above. The power supply 22 converts the relatively low ac voltage to a high dc voltage, such as 20 kv, according to a fixed ratio. Thus, by varying the tap of the autotransformer 18 from zero to full value, the output of the power supply 22 varies from zero to its full value.

The negative or high potential terminal of power supply 22 is connected through a current limiting resistor 30 to a beaded chain test electrode 34, an integrating capacitor 36 and a precision voltage metering resistor 38. The positive or low potential terminal of power supply 22 is connected through a resistor 40 and a Colpitts $rf$ oscillator 42 to ground potential. It should be noted that the wires within the twisted conductors $C_1$ and $C_2$ are also connected to machine ground so that spark discharges between the electrode 34 and the wires produce current pulses flowing between the output terminals of power supply 22.

The Colpitts oscillator 42 is formed by a tank circuit 44 which is capacitively coupled to a transistor 46 having an emitter follower output resistor 48. The oscillator is designed so that it functions at a substantially fixed frequency, for example 60kHz, and develops an $rf$ output signal across resistor 48 having an apmplitude proportional to the dc current flowing between the output terminals of the power supply 22. For example, the range of current may extend from a few microamperes in the absence of a spark to more than one milliampere. Spark gap 50 and zener diode 52 prevent excessive voltages from being applied to the oscillator circuit.

The high potential dc voltage existing between the electrode 34 and the grounded wires of the conductors $C_1$ and $C_2$ is accuratedly indicated by measuring the current flow through precision resistor 38. The side of the resistor connected to slip ring assembly 60 is very close to ground potential since it is connected to ground through the assembly 60, a microammeter 62 and a series circuit made up of small resistors 64, 66 and 68. The microammeter 62 is deflected by the dc current flowing through precision resistor 38 from the power supply 22 but is preferably calibrated in terms of voltage present at the electrode 34.

As mentioned above, the amplitude of the $rf$ signal appearing across the resistor 48 is proportional to the dc current flowing between the terminals of the power supply 22. This current is comprised of two components, the first being the current required to deflect the meter 62, which is readily predictable, and the second being the current which flows between the test electrode 34 and ground due to a fault in the insulation covering conductors $C_1$ and $C_2$, under test. Thus, the Colpitts oscillator 42 is a current sensitive device, and the output signal from the oscillator is a low voltage signal repesenting the detected current.

Since the $rf$ signal and the dc signal monitoring the high potential of power supply 22 through the precision resistor 38 have characteristically distinct electrical signal forms, they may be transmitted simultaneously through the same slip ring assembly 60 to discriminating circuitry for separate detection. The $rf$ signal from oscillator 42 is coupled through a capacitor 70, slip ring assembly 60 and a capacitor 72 to an rf detector 74 which generates a dc current signal proportional to the $rf$ signal. The dc signal monitoring the high potential of power supply 22 in transmitted through the slip ring assembly 60 and monitored at the meter 62. Resistor 38 and meter 62 present high impedances to the $rf$ signal while the capacitors 70 and 72 effectively decouple the dc signal from the $rf$ oscillator 42 and detector 74. Thus, separate discriminating circuits connected with the one slip ring assembly 60 receive and detect the two signals in different forms.

Within the detector 74, resistors 80 and 82 connected with the rectified output of transformer 16 establish a bias on the base of transistor 84 so that the transistor operates in a linear range. The resistor 90 connected to the emitter introduces degeneration so as to make the gain at the input of the detector independent of the characteristics of transistor 84.

The collector load of the transistor 84 is formed by an inductor 92 which emphasizes the leading edge of the $rf$ burst received from the oscillator 42 when a fault is detected. The diodes 94 and 96 together with the capacitor 98 and bleeder resistor 68 form a half-wave doubler rectifier which produces a negative dc voltage signal at the junction of the diode 96 and capacitor 98 which signal is proportional to the rf input of the detector.

Current flows through the resistor 66 in response in response to the negative voltage signal developed at the output of the $rf$ oscillator 74 and into the input of the Norton (current-operated) operational amplifier 100. The value of resistor 66 is selected so that the current deflecting meter 62 is subtracted from the total current signal developed by the $rf$ detector 74 at the input of amplifier 100 to offset that part of the total current as sensed by the $rf$ oscillator 42 attributable to the meter current. By this means, the meter current and the spark current flowing from the test electrode 34 through the conductors $C_1$ and $C_2$ to ground are discriminated, and the net input to amplifier 100 corresponds only to the spark current. The amplifier 100 is phased so that the output signal goes positive as the input current increases. The gain through the amplifier 100 is established by the feedback resistor 102 in conventional fashion.

Accordingly, the output signal from amplifier 100 represents the discharging current which is generated whenever a fault passes by the test electrode 34 and a spark is generated whenever a fault passes by the test electrode 34 and a spark is generated. Such current is transmitted to appropriate amplifying circuits illustrated in FIG. 2B for sensing, fault measurement, counting and other functions.

In FIG. 2B, zener diode 110 becomes conductive when the output signal of amplifier 100 goes sufficiently positive and triggers a regenerative amplifier 112 including transistors 114 and 116. Normally, the two transistors are non-conducting; however, when zener diode 110 becomes conductive due to sparking from the electrode 34, transistor 114 becomes conductive and thereupon causes transistor 116 to also conduct and generate a positive voltage on the collector in view of the load resistor 118. Such voltage causes zener diode 120 to become conductive by way of resistor 122 and couples a positive current pulse through capacitor 124 to the base resistor 126 of transistor 114 to increase the base current. Thus, the capacitor 124 and resistor 126 complete a regenerative loop in the amplifier 112. As a result, even if zener diode 110 conducts for a very brief time, the minimum conduction period of transistors 114 and 116 is determined by the charge time of capacitor 124 and resistor 126.

When transistor 116 conducts, the transistor 130 is switched to a conductive state by current in resistor 132 and the transistor 130 in turn pulses the coil of fault couner 134. The zener diode 136 and diode 138 prevent the inductive transients of the coil from damaging the transistor 130 when the transistor is turned off.

The fault counter 134 is of the "predetermining" type and is comprised electrically of the counting coil 136, the reset coil 138 and normally open conacts 140 which close when a pre-established count is reached. The coil 136 indexes a drum in the counter with each pulse and when a predetermined rotation occurs, corresponding to a predetermined count, the contacts 140 are closed by the drum. In other words, the contacts 140 remain open until the number of pulses received by the counting coil 136 equals a predetermined number to which the fault counter is set, at which time they close. The drum is reset to a zero count by means of reset coil 138 and switch 150.

Closure of the contacts 140 places a positive potential on the gate of SCR 142 through the gate resistor 144, and then the SCR being triggered into conduction turns on the warning lamp 146 which indicates that the predetermined number of faults has been detected. The warning lamp 146 remains lit until it is reset by switch 148.

In a typical operation, the switch 150 is engaged at the beginning of each new spool of conductor which to be tested, or it can be closed at the beginning of each 1,000 feet of conductor by means of a switch connected with metering equipment on the pairing machine. By setting the counter 134 to a number representing the maximum tolerably faults per section of conductor, the warning lamp is energized automatically whenever a section of unacceptable conductor passes through the tester.

Resistors 160 and 162 are arranged to charge a capacitor 164 during the conduction interval of transistors 114 and 116, and the transistor 166 is connected to discharge the capacitor rapidly through resistor 162 at the conclusion of such interval. The maximum potential to which the capacitor is charged is therefore a function of the time duration of the fault pulse produced in the regenerative amplifier 112. The time constant of the resistors 160, 162 and capacitor 164 is chosen so that the charging potential of the capacitor is never sufficient to place the Darlington transistor amplifier 170 in conduction during a pulse which results solely from a pin hole fault in the instulation. However, a longer fault pulse resulting from a bare wire interval on a conductor $C_1$ or $C_2$ allows the capacitor 164 to charge to a potential which places the Darlington amplifier 170 in conduction and charges capacitor 172 and capacitor 174 through resistor 176. When the capacitor 174 is charged to the gating potential of SCR 178, the SCR becomes conductive and energizes the warning lamp 180. Once the warning lamp 180 has been turned on, it remains turned on in the same manner as the warning lamp 146 until the reset switch 148 is momentarily opened.

It should be understood that relays connected in series with either of the warning lamsp could easily be operated with the lamps and, the contacts of such relays may be connected to stop the "twinner" machine, if desired, or to energize further external alarm devices to indicate that the detected faults are out of tolerance.

It will be appreciated that the insulation tester of the pesent invention permits high potential insulation tests to be conducted on an insulated conductor within a rotating mechanism while the controls for the tester and the monitoring of the tester and the test results is accomplished in a nonrotating environment at a remote location. Only two slip ring assemblies are required in addition to a ground path to transmit low voltage power and signals between the rotating mechanism and the non-rotating environment, but at the same time, the insulation test is conducted at a high voltage level.

While the present invention has been described in a preferred embodiment, it should be understood that numerous modifications and substitutions can be made without departing from the spirit of the invention. For example, the detection of fault signals, once they are discriminated from the voltage monitoring signal, may be accomplished by circuits other than that disclosed. Other types of counters than the counter 134 may be utilized to manifest the excessive pin hole count in the conductor under test. The specific circuitry illustrated may also be modified without departing from the basic function which such circuitry performs. Accordingly, the present invention has been described in a preferred embodiment by way of illustration rather than limitation.

We claim:

1. A high potential d.c. insulation tester for testing insulation on a conductor at a first station within a rotating environment for detection at a second remote station in a non-rotating environment comprising:
   a high potential d.c. power supply at the first station having first and second output terminals between which a high potential is produced;
   a testing electrode connected to the first output terminal for applying a high potential from the power supply to the insulation under test;
   current sensitive means also at the first station connected with an output terminal of the power supply and having a low voltage output producing a signal indicative of current flowing between the output terminals of the power supply;
   detection means at the second station responsive to the signal from the current sensitive means for detecting current from the d.c. power supply; and
   rotatable electrical coupling means connected between the current sensitive means and the detecting means for receiving the low voltage output signal at the first station within the rotating environment and transmitting the signal to the second station in the non-rotating environment.

2. A high potential dc insulation tester as defined in claim 1 further including an electrical power source in the non-rotating environment and another rotatable electrical coupling means connected between the high potential dc power supply and the electrical power source for delivering electrical power to the power supply within the rotating environment from the non-rotating environment.

3. A high potential dc insulation tester as defined in claim 2 wherein the electrical power source is an adjustable low voltage electrical power source and wherein the high potential dc power supply provides a high potential output as a function of the power input whereby adjustment of the low voltage electrical power supply in the non-rotating environment causes the high potential dc output within the rotating environment to be adjusted.

4. A high potential dc insulation tester as defined in claim 1 further including:
voltage monitoring means within the rotating environment connected with the high potential power supply to produce a low voltage monitoring signal, the monitoring means being connected to the rotatable electrical coupling means to permit the monitoring signal to be transmitted from within the rotating environment to the non-rotating environment.

5. A high potential dc insulation tester as defined in claim 4 wherein:
the voltage monitoring means and the current sensitive means produce characteristically distinct electrical signal forms and the rotatable electrical coupling means is connected to transmit both signal forms to the non-rotating environment.

6. A high potential d.c. insulation tester as defined in claim 5 wherein the detecting means includes discriminating circuits connected with the nonrotating coupling means for receiving and separately detecting the current sensitive and voltage monitoring signals transmitted by the coupling means in the different signal forms.

7. A high potential d.c. insulation tester as defined in claim 5 wherein the voltage monitoring means produces a d.c. signal and the current sensitive means produces a high frequency signal.

8. A high potential d.c. insulation tester as defined in claim 1 wherein:
the current sensitive means comprises an r.f. oscillator connected to the second output terminal of the power supply and having an output terminal providing an r.f. signal indicative of the current flowing between the output terminals of the power supply.

9. A high potential d.c. insulation tester as defined in claim 8 wherein the detecting means includes an r.f. detector connected with the output of the r.f. oscillator through the rotatable electrical coupling means to receive the r.f. signal and provide a d.c. current signal.

10. A high potential d.c. insultation tester as defined in claim 1 for detecting pin hole faults in the insulation further including:
amplifying means in the non-rotating environment connected with the current sensitive means through the rotatable electrical coupling means for generating a current signal with each discharge of current from the electrode through the insulation; and
a counter connected with the amplifying means to receive and record the number of current signals and faults in the insulation under test.

11. A high potential d.c. insulation tester, as defined in claim 10 further including timing means in the non-rotating environment connected with the amplifying means for identifying current signals having a duration greater than a given period of time to identify bare wire intervals in the conductor passing by the electrode.

* * * * *